United States Patent
Dutta et al.

(10) Patent No.: US 10,068,656 B2
(45) Date of Patent: Sep. 4, 2018

(54) NON-VOLATILE MEMORY WITH MULTI-PASS PROGRAMMING

(71) Applicant: SANDISK TECHNOLOGIES LLC, Plano, TX (US)

(72) Inventors: Deepanshu Dutta, Fremont, CA (US); Sarath Puthenthermadam, San Jose, CA (US); Chris Yip, Saratoga, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/391,006

(22) Filed: Dec. 27, 2016

(65) Prior Publication Data

US 2018/0182463 A1    Jun. 28, 2018

(51) Int. Cl.
*G11C 16/34* (2006.01)
*G11C 16/10* (2006.01)
*G11C 16/04* (2006.01)
*G11C 16/26* (2006.01)
*G06F 3/06* (2006.01)

(52) U.S. Cl.
CPC ........ *G11C 16/3427* (2013.01); *G06F 3/0619* (2013.01); *G06F 3/0626* (2013.01); *G06F 3/0658* (2013.01); *G06F 3/0679* (2013.01); *G11C 16/0483* (2013.01); *G11C 16/10* (2013.01); *G11C 16/26* (2013.01); *G11C 16/3459* (2013.01)

(58) Field of Classification Search
CPC .................................................. G11C 16/3427
See application file for complete search history.

(56) References Cited

U.S. PATENT DOCUMENTS

| | | | |
|---|---|---|---|
| 7,301,810 B2 | 11/2007 | Chen | |
| 7,619,930 B2 | 11/2009 | Mokhlesi | |
| 9,165,659 B1 | 10/2015 | Pang et al. | |
| 9,230,663 B1 | 1/2016 | Lu et al. | |
| 9,324,419 B2 | 4/2016 | Pang | |
| 9,343,141 B2 | 5/2016 | Pang | |
| 2009/0109746 A1 | 4/2009 | Aritome | |
| 2014/0068222 A1* | 3/2014 | Park | G06F 12/06 711/202 |
| 2016/0180934 A1 | 6/2016 | Sakui | |
| 2016/0211032 A1 | 7/2016 | Pang | |

\* cited by examiner

*Primary Examiner* — Hoai V Ho
*Assistant Examiner* — Jay Radke
(74) *Attorney, Agent, or Firm* — Vierra Magen Marcus LLP

(57) ABSTRACT

A non-volatile memory system implements a multi-pass programming process that includes separately programming groups of memory cells in a common block by performing programming for memory cells that are connected to two adjacent word lines and are part of a first group of memory cells followed by performing programming for other memory cells that are also connected to the two adjacent word lines and are part of a second group of memory cells.

21 Claims, 17 Drawing Sheets

| WL | Foggy/Fine | Str0 | Str1 | Str2 | Str3 |
|---|---|---|---|---|---|
| WL47 | Fine | 380 | 381 | 382 | 383 |
| | Foggy | 372 | 374 | 376 | 378 |
| WL46 | Fine | 373 | 375 | 377 | 379 |
| | Foggy | 364 | 366 | 368 | 370 |
| ... | | | | | |
| WL5 | Fine | 45 | 47 | 49 | 51 |
| | Foggy | 36 | 38 | 40 | 42 |
| WL4 | Fine | 37 | 39 | 41 | 43 |
| | Foggy | 28 | 30 | 32 | 34 |
| WL3 | Fine | 29 | 31 | 33 | 35 |
| | Foggy | 20 | 22 | 24 | 26 |
| WL2 | Fine | 21 | 23 | 25 | 27 |
| | Foggy | 12 | 14 | 16 | 18 |
| WL1 | Fine | 13 | 15 | 17 | 19 |
| | Foggy | 1 | 4 | 7 | 10 |
| WL0 | Fine | 2 | 5 | 8 | 11 |
| | Foggy | 0 | 3 | 6 | 9 |

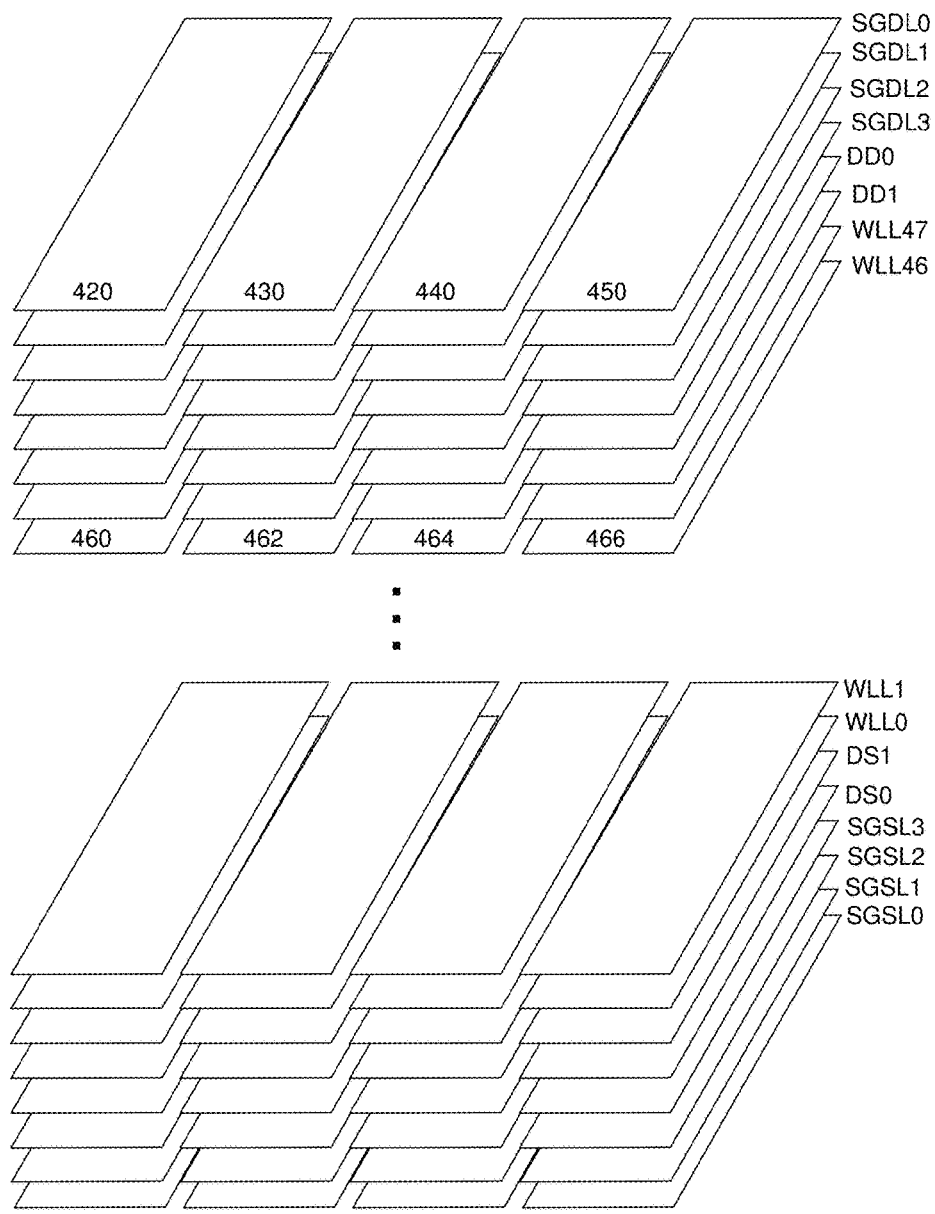

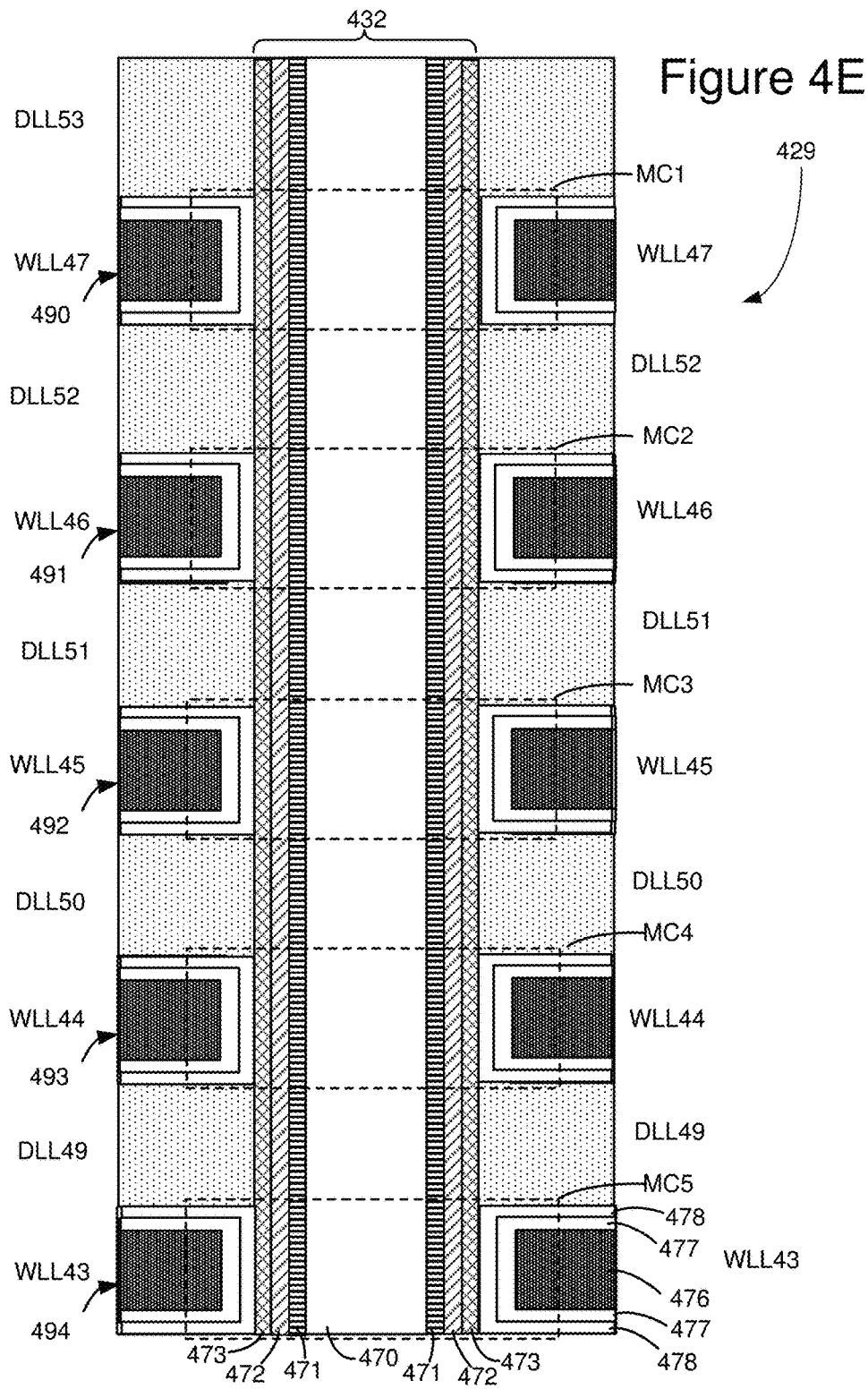

|              | S0 | S1 | S2 | S3 | S4 | S5 | S6 | S7 |
|--------------|----|----|----|----|----|----|----|----|
| Upper Page   | 1  | 1  | 1  | 0  | 0  | 0  | 0  | 1  |
| Middle Page  | 1  | 1  | 0  | 0  | 1  | 1  | 0  | 0  |
| Lower Page   | 1  | 0  | 0  | 0  | 0  | 1  | 1  | 1  |

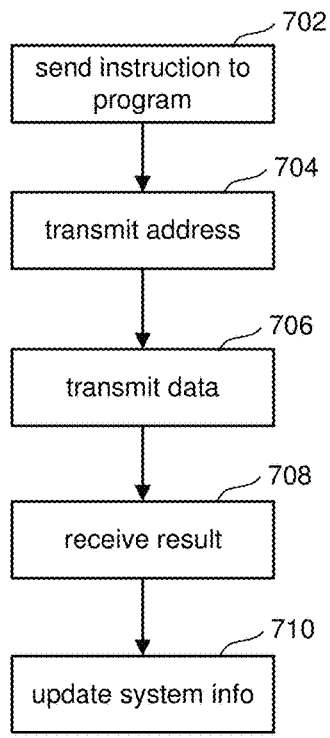
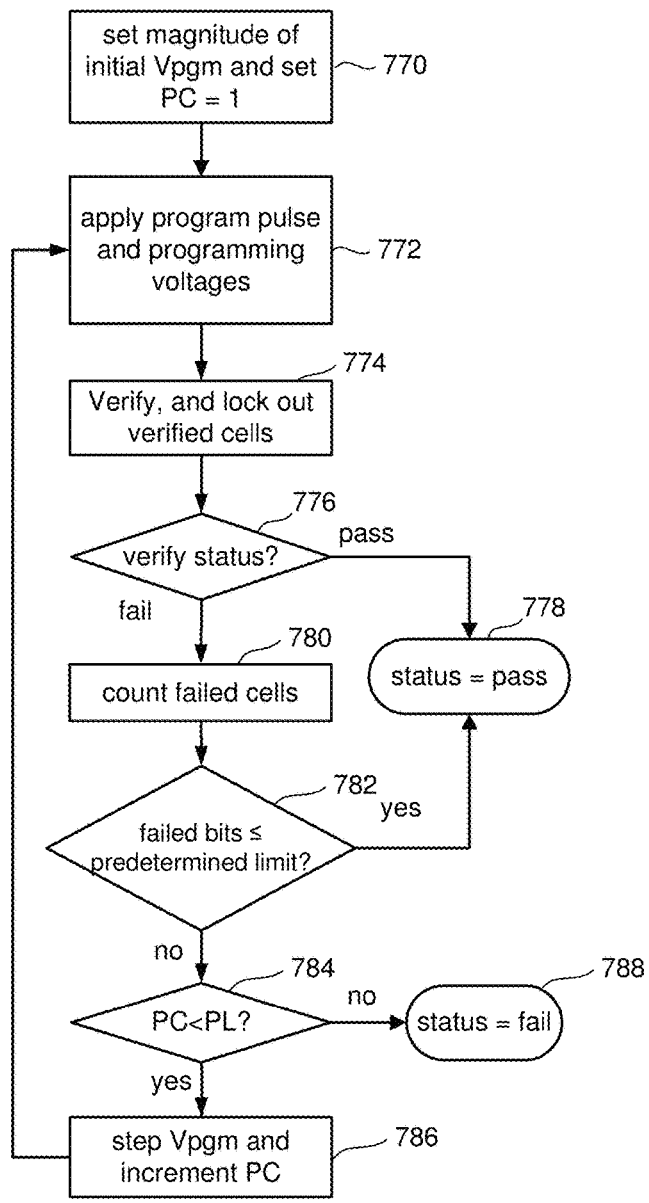

Figure 10

| WL | Str0 | Str1 | Str2 | Str3 |
|---|---|---|---|---|
| WL47 | 188 | 189 | 190 | 191 |
| WL46 | 184 | 185 | 186 | 187 |
| ... | | | | |
| WL5 | 20 | 21 | 22 | 23 |
| WL4 | 16 | 17 | 18 | 19 |
| WL3 | 12 | 13 | 14 | 15 |
| WL2 | 8 | 9 | 10 | 11 |
| WL1 | 4 | 5 | 6 | 7 |
| WL0 | 0 | 1 | 2 | 3 |

Figure 11

| WL | Foggy/Fine | Str0 | Str1 | Str2 | Str3 |
|---|---|---|---|---|---|
| WL47 | Fine | 380 | 381 | 382 | 383 |
| WL47 | Foggy | 372 | 373 | 374 | 375 |
| WL46 | Fine | 376 | 377 | 378 | 379 |
| WL46 | Foggy | 364 | 365 | 366 | 367 |
| ... | | | | | |
| WL5 | Fine | 48 | 49 | 50 | 51 |
| WL5 | Foggy | 36 | 37 | 38 | 39 |
| WL4 | Fine | 40 | 41 | 42 | 43 |
| WL4 | Foggy | 28 | 29 | 30 | 31 |
| WL3 | Fine | 32 | 33 | 34 | 35 |
| WL3 | Foggy | 20 | 21 | 22 | 23 |
| WL2 | Fine | 24 | 25 | 26 | 27 |
| WL2 | Foggy | 12 | 13 | 14 | 15 |
| WL1 | Fine | 16 | 17 | 18 | 19 |
| WL1 | Foggy | 4 | 5 | 6 | 7 |
| WL0 | Fine | 8 | 9 | 10 | 11 |
| WL0 | Foggy | 0 | 1 | 2 | 3 |

Figure 12

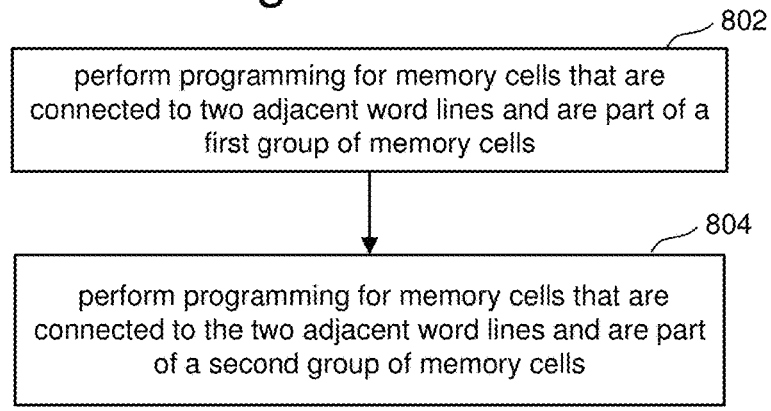

802 — perform programming for memory cells that are connected to two adjacent word lines and are part of a first group of memory cells 804 — perform programming for memory cells that are connected to the two adjacent word lines and are part of a second group of memory cells

Figure 13

| WL | Foggy/Fine | Str0 | Str1 | Str2 | Str3 |
|---|---|---|---|---|---|
| WL47 | Fine | 380 | 381 | 382 | 383 |
| | Foggy | 372 | 374 | 376 | 378 |
| WL46 | Fine | 373 | 375 | 377 | 379 |
| | Foggy | 364 | 366 | 368 | 370 |
| | ... | | | | |
| WL5 | Fine | 45 | 47 | 49 | 51 |
| | Foggy | 36 | 38 | 40 | 42 |
| WL4 | Fine | 37 | 39 | 41 | 43 |
| | Foggy | 28 | 30 | 32 | 34 |
| WL3 | Fine | 29 | 31 | 33 | 35 |
| | Foggy | 20 | 22 | 24 | 26 |
| WL2 | Fine | 21 | 23 | 25 | 27 |
| | Foggy | 12 | 14 | 16 | 18 |
| WL1 | Fine | 13 | 15 | 17 | 19 |
| | Foggy | 1 | 4 | 7 | 10 |
| WL0 | Fine | 2 | 5 | 8 | 11 |
| | Foggy | 0 | 3 | 6 | 9 |

| Steps | Cache |
|---|---|
| 28 and 29 | WL3/Str0, WL3/Str1, WL3/Str2, WL3/Str3, WL4/Str0 |
| 30 and 31 | WL3/Str1, WL3/Str2, WL3/Str3, WL4/Str0, WL4/Str1 |
| 32 and 33 | WL3/Str2, WL3/Str3, WL4/Str0, WL4/Str1, WL4/Str2 |
| 34 and 35 | WL3/Str3, WL4/Str0, WL4/Str1, WL4/Str2, WL4/Str3 |

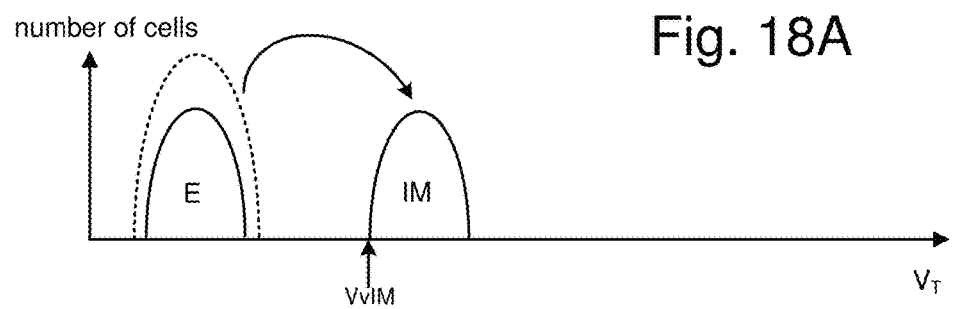
Fig. 18A
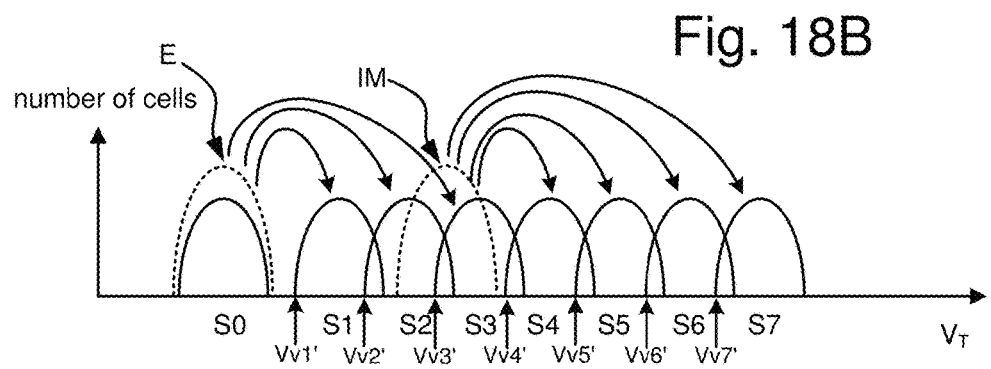
Fig. 18B
Figure 19
|  | S0 | S1 | S2 | S3 | S4 | S5 | S6 | S7 |
|---|---|---|---|---|---|---|---|---|
| Upper Page | 1 | 0 | 0 | 1 | 1 | 1 | 0 | 0 |
| Middle Page | 1 | 1 | 0 | 0 | 0 | 1 | 1 | 0 |
| Lower Page | 1 | 1 | 1 | 1 | 0 | 0 | 0 | 0 |

NON-VOLATILE MEMORY WITH MULTI-PASS PROGRAMMING

BACKGROUND

Semiconductor memory is widely used in various electronic devices such as cellular telephones, digital cameras, personal digital assistants, medical electronics, mobile computing devices, non-mobile computing devices and data servers. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others.

When a memory system is deployed in or connected to an electronic device (the host), the memory system can be used to program data, read data and/or erase data. It is important that once data is stored in a memory system, the data can be read back.

BRIEF DESCRIPTION OF THE DRAWINGS

Like-numbered elements refer to common components in the different figures.

FIG. 4D depicts a view of the select gate layers and word line layers.

FIG. 4E is a cross sectional view of a vertical column of memory cells.

FIG. 9A is a flow chart describing one embodiment of a process for programming.

FIG. 9B is a flow chart describing one embodiment of a process for programming.

FIG. 10 is a table that describes order of steps in one embodiment of a full sequence programming process.

FIG. 11 is a table that describes order of steps in one embodiment of a multi-pass programming process.

FIG. 12 is a flow chart describing one embodiment of a multi-pass programming process.

FIG. 13 is a table that describes order of steps in one embodiment of a multi-pass programming process.

FIGS. 18A and 18B depict threshold voltage distributions and an example of a multi-pass programming process.

FIG. 19 is a table describing one example of an assignment of data values to data states.

DETAILED DESCRIPTION

It has been observed that memory cells of some non-volatile storage devices are subjected to interference due to a fringing field capacitance effect from memory cells on a neighboring word line and due to electrons drifting between memory cell due to a shared charge trapping layer. Two-pass programming techniques provide a counter measure to such interference. However, two-pass programming techniques require large amounts of program data to be cached. Therefore, a new multi-pass programming technique is proposed that reduces the need for caching.

One embodiment of the proposed new multi-pass programming process includes separately programming groups of memory cells in a common block by performing programming for memory cells that are connected to two adjacent word lines and are part of a first group of memory cells followed by performing programming for other memory cells that are also connected to the two adjacent word lines and are part of a second group of memory cells.

Figure 1:
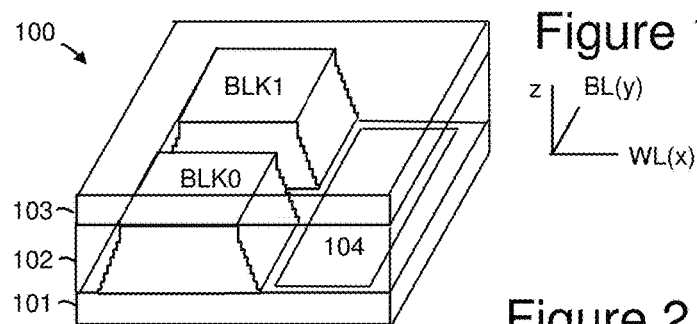
FIG. 1 is a perspective view of a 3D stacked non-volatile memory device.

FIGS. 1-4F describe one example of a memory system that can be used to implement the technology proposed herein. FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions. In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
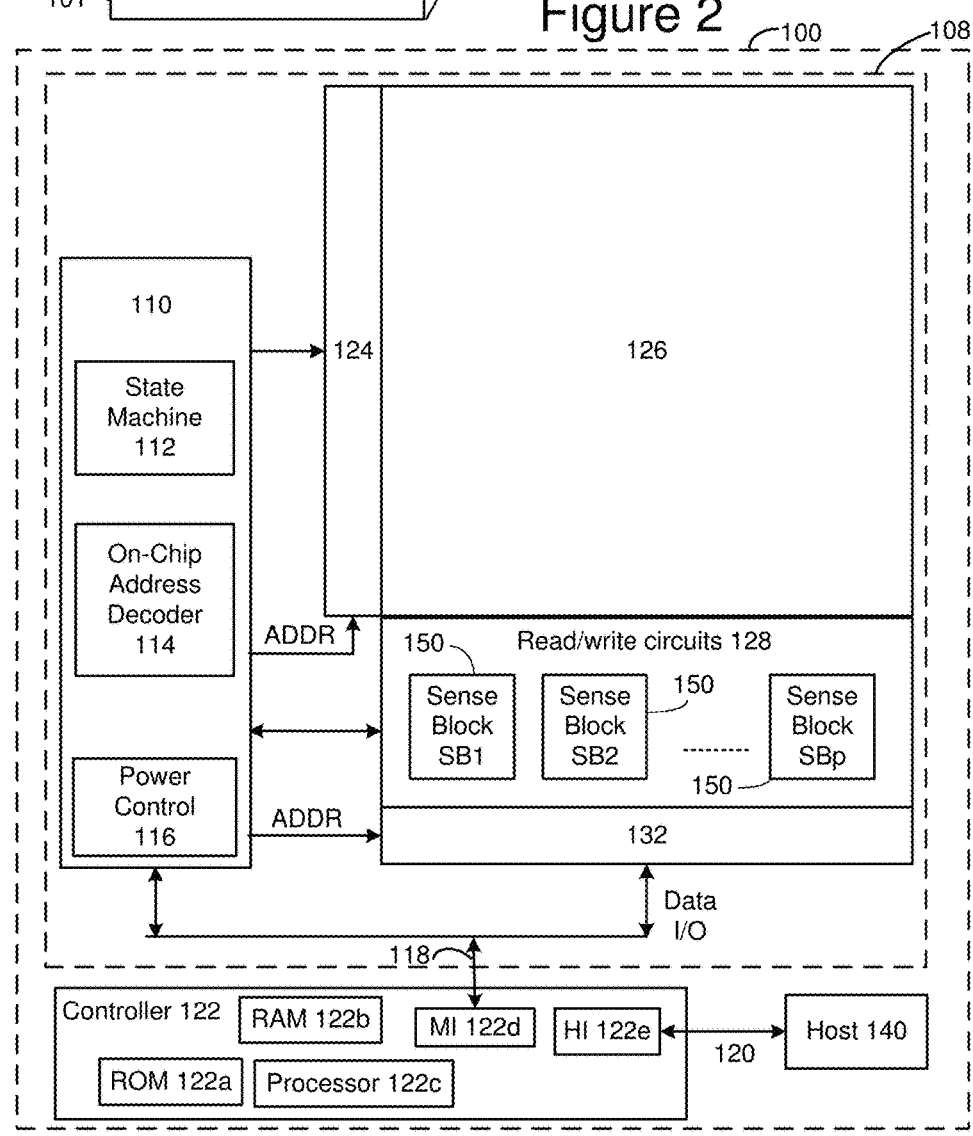
FIG. 2 is a block diagram of a memory apparatus.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a three dimensional monolithic array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, a power control module 116 and a temperature detection circuit 116. The state machine 112 provides die-level control of memory operations. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers.

Any one or any combination of control circuitry 110, state machine 112, decoders 114/124/132, power control module 116, sense blocks 150, read/write circuits 128, and controller 122 can be considered one or more control circuits (or a managing circuit) that performs the functions described herein. The one or more control circuits can include hardware only or a combination of hardware and software (including firmware). For example, a controller programmed by firmware to perform the functions described herein is one example of a control circuit The (on-chip or off-chip) controller 122 (which in one embodiment is an electrical circuit) may comprise one or more processors 122c, ROM 122a, RAM 122b, a memory interface 122d and a host interface 122e, all of which are interconnected. One or more processors 122c is one example of a control circuit. Other embodiments can use state machines or other custom circuits designed to perform one or more functions. The storage devices (ROM 122a, RAM 122b) stored code (software) such as a set of instructions (including firmware), and one or more processors 122c is/are operable to execute the set of instructions to provide the functionality described herein. Alternatively or additionally, one or more processors 122c can access code from a storage device in the memory structure, such as a reserved area of memory cells connected to one or more word lines. RAM 122b can be to store data for controller 122, including caching program data (discussed below). Memory interface 122d, in communication with ROM 122a, RAM 122b and processor 122c, is an electrical circuit that provides an electrical interface between controller 122 and one or more memory die 108. For example, memory interface 122d can change the format or timing of signals, provide a buffer, isolate from surges, latch I/O, etc. One or more processors 122c can issue commands to control circuitry 110 (or any other component of memory die 108) via Memory Interface 122d. In one embodiment, one or more processors 122c can access code from ROM 122a or RAM 122b to receive a request to read from the host that includes an operation limitation, perform a read process on the memory die 108 within the operation limitation and return data to the host from the read process that includes errors in response to the request to read. Host interface 122e provides an electrical interface with host 140 data bus 120 in order to receive commands, addresses and/or data from host 140 to provide data and/or status to host 140.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a unit of serially connected memory cells.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

In one set of embodiments, a three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form vertical NAND strings that traverse across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
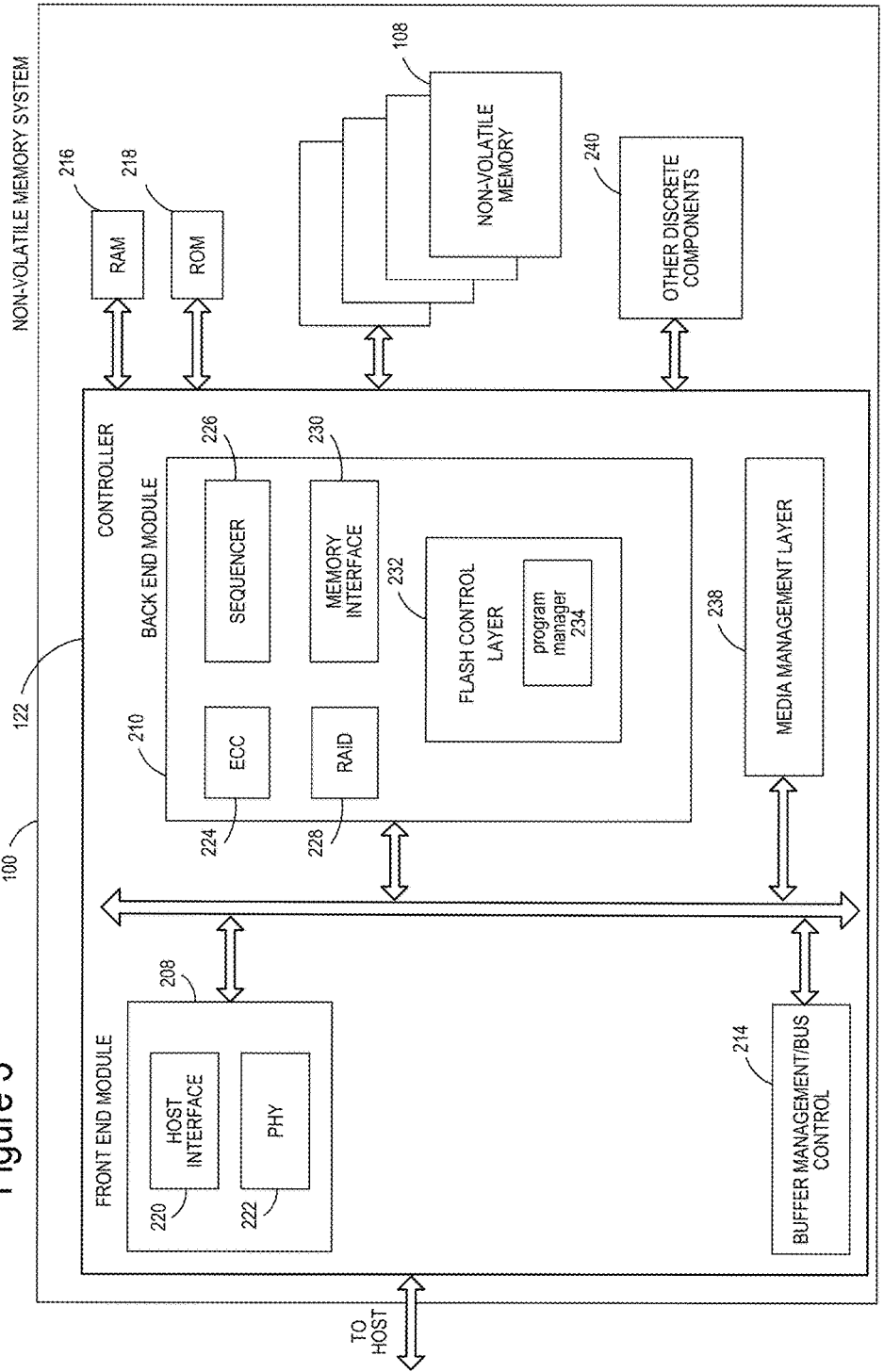
FIG. 3 is a block diagram of a memory apparatus.

FIG. 3 is a block diagram of example memory system 100, depicting more details of one example implementation of controller 122. As used herein, a flash memory controller is a device that manages data stored on flash memory and communicates with a host, such as a computer or electronic device. A flash memory controller can have various functionality in addition to the specific functionality described herein. For example, the flash memory controller can manage the read and programming processes, format the flash memory to ensure the memory is operating properly, map out bad flash memory cells, and allocate spare memory cells to be substituted for future failed cells. Some part of the spare memory cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable memory interface, such as Toggle Mode 200, 400, or 800. In one embodiment, memory system 100 may be a card based system, such as a secure digital (SD) or a micro secure digital (micro-SD) card that can be in or connected to cellular telephones, computers, servers, smart appliances, digital cameras, etc. In an alternate embodiment, memory system 100 may be part of an embedded memory system. In another example, the memory system may be in the form of a solid state disk (SSD) drive (having one or, more memory die 108) installed in or connected to a personal computer or server. Thus, examples of hosts are cellular telephones, computers, servers, smart appliances, digital cameras, etc.

In some embodiments, non-volatile memory system 100 includes a single channel between controller 122 and non-volatile memory die 108, however, the subject matter described herein is not limited to having a single memory channel. For example, in some memory system architectures, 2, 4, 8 or more channels may exist between the controller and a memory die, depending on controller capabilities. In any of the embodiments described herein, more than a single channel may exist between the controller and the memory die, even if a single channel is shown in the drawings.

As depicted in FIG. 3, controller 126 includes a front end module 208 that interfaces with a host, a back end module 210 that interfaces with the one or more non-volatile memory die 108, and various other modules that perform functions which will now be described in detail.

The components of controller 122 depicted in FIG. 3 may take the form of a packaged functional hardware unit (e.g., an electrical circuit) designed for use with other components, a portion of a program code (e.g., software or firmware) executable by a (micro) processor or processing circuitry that usually performs a particular function or related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor or circuit for controller 122 to perform the functions described herein. The architecture depicted in FIG. 3 is one example implementation that may (or may not) use the components of controller 122 depicted in FIG. 2 (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 3 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, controller 122, RAM 216, and ROM 218 may be located on separate semiconductor die. In some embodiments, a portion of RAM 216 is used to cache program data.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 (electrical circuit, software or combination of circuit and software) that encodes the data bytes received from the host, and decodes and error corrects the data bytes read from the non-volatile memory. A command sequencer 226 generates command sequences, such as program/read/erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface.

A flash control layer 232 (firmware and/or hardware, such as an electrical circuit) controls the overall operation of back end module 210. Flash control layer 232 includes a program manager 234 that manages the multi-pass programming processes described below. Program manager 234 can be implemented as a dedicated electrical circuit or via software (e.g., firmware). In one embodiment, program manager 234 performs a multi-pass programming process for the memory cells of memory die 108 by implementing a technique that includes starting programming for memory cells connected to a particular word line and a particular subset of the NAND strings and then completing programming for memory cells connected to an adjacent word line and the particular subset of NAND strings prior to starting programming for memory cells connected to the particular word line and a next subset of the NAND strings.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because in some embodiments: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126.

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside or connected to a host, as a NAS device, etc. Additionally, the SSD need not be made to emulate a hard drive.

Figure 4:
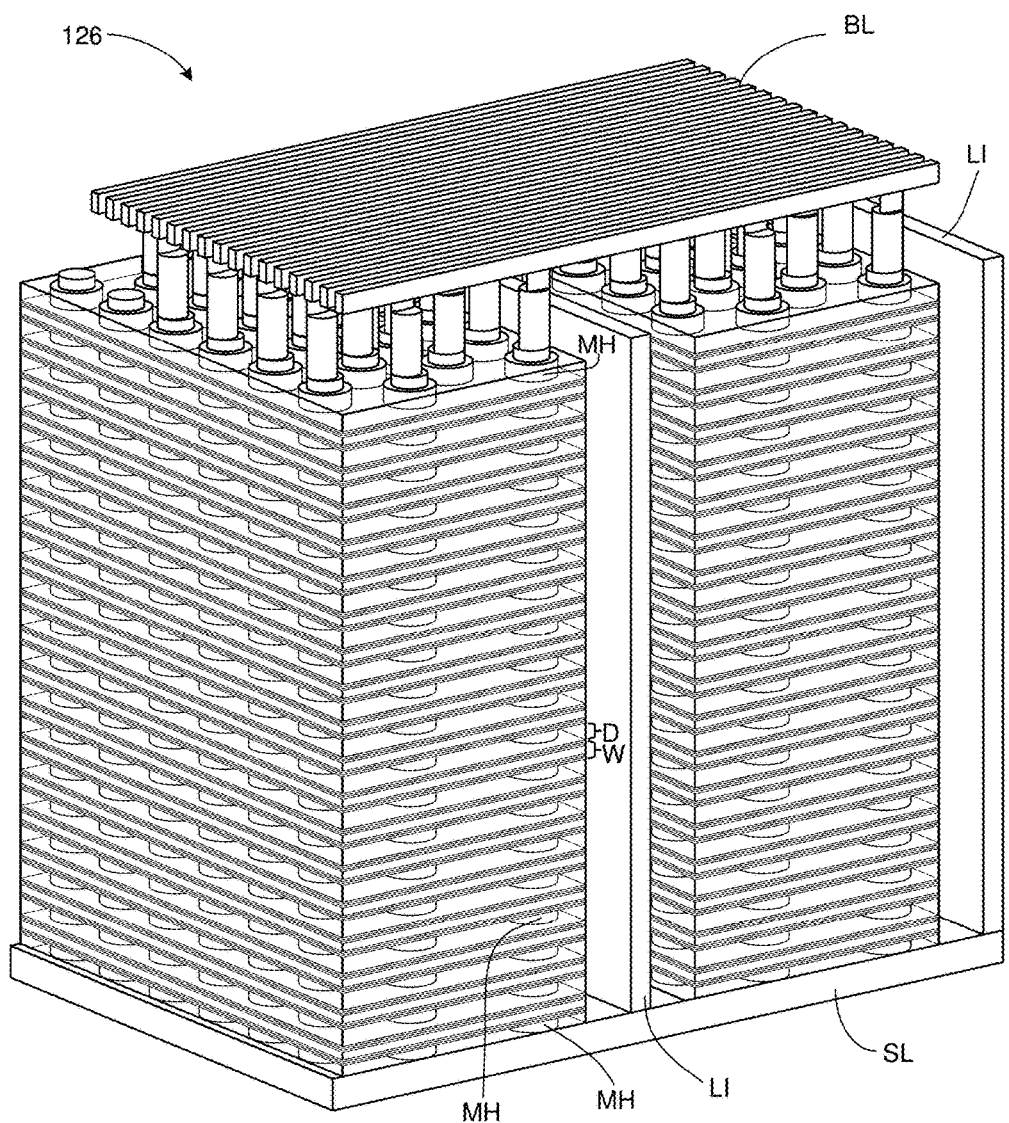
FIG. 4 is a perspective view of a portion of one embodiment of a monolithic three dimensional memory structure.

FIG. 4 is a perspective view of a portion of one example embodiment of a monolithic three dimensional memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "strings" by local interconnects LI. FIG. 4 only shows two strings and two local interconnects LI. In one embodiment, each "string" is a group of vertical NAND strings. In other embodiments, a "string" can be another grouping of serially connected memory cells.

Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory structure 126 are provided below with respect to FIG. 4A-4F.

Figure 4A:
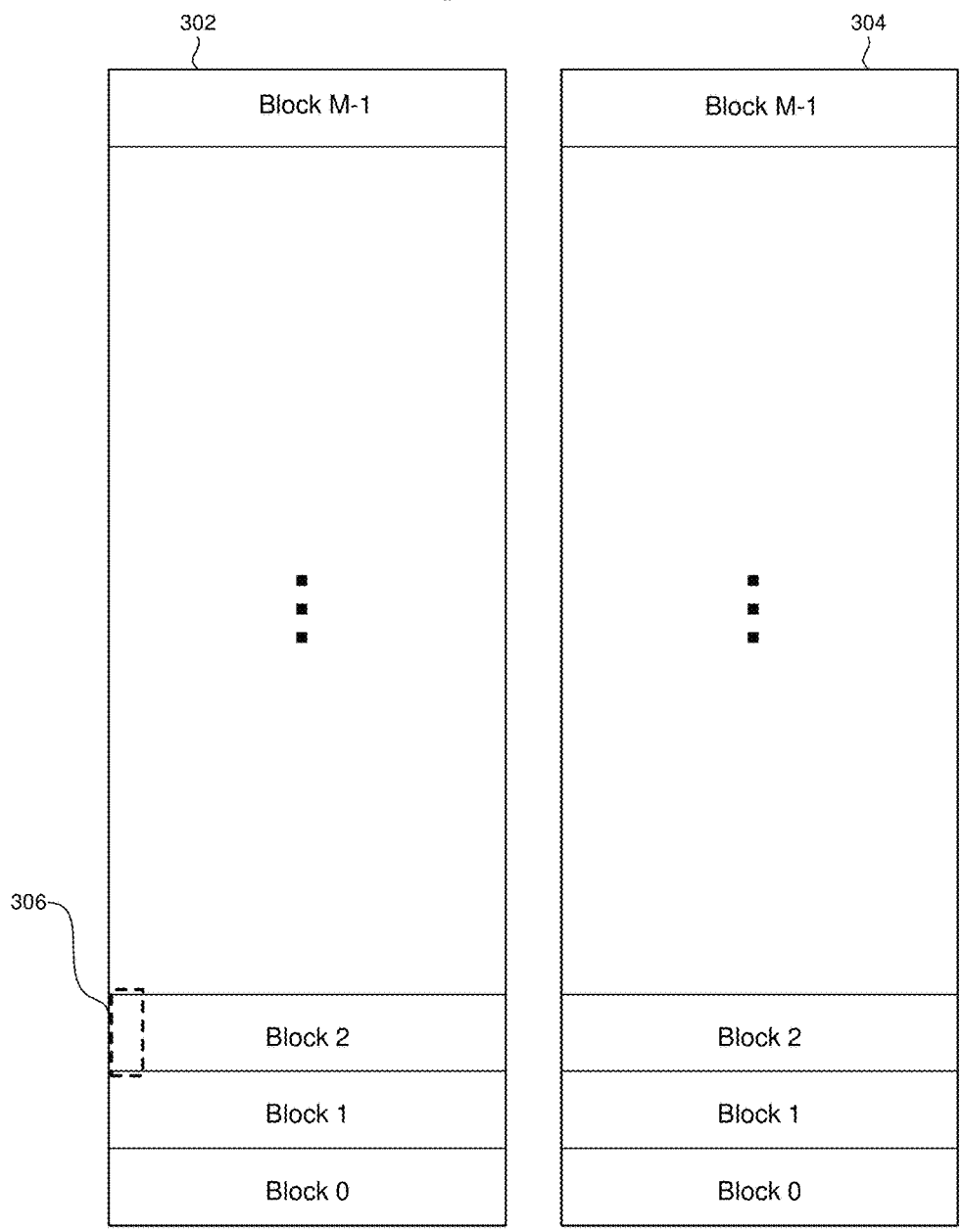
FIG. 4A is a block diagram of a memory structure having two planes.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for one example of two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . . In one embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
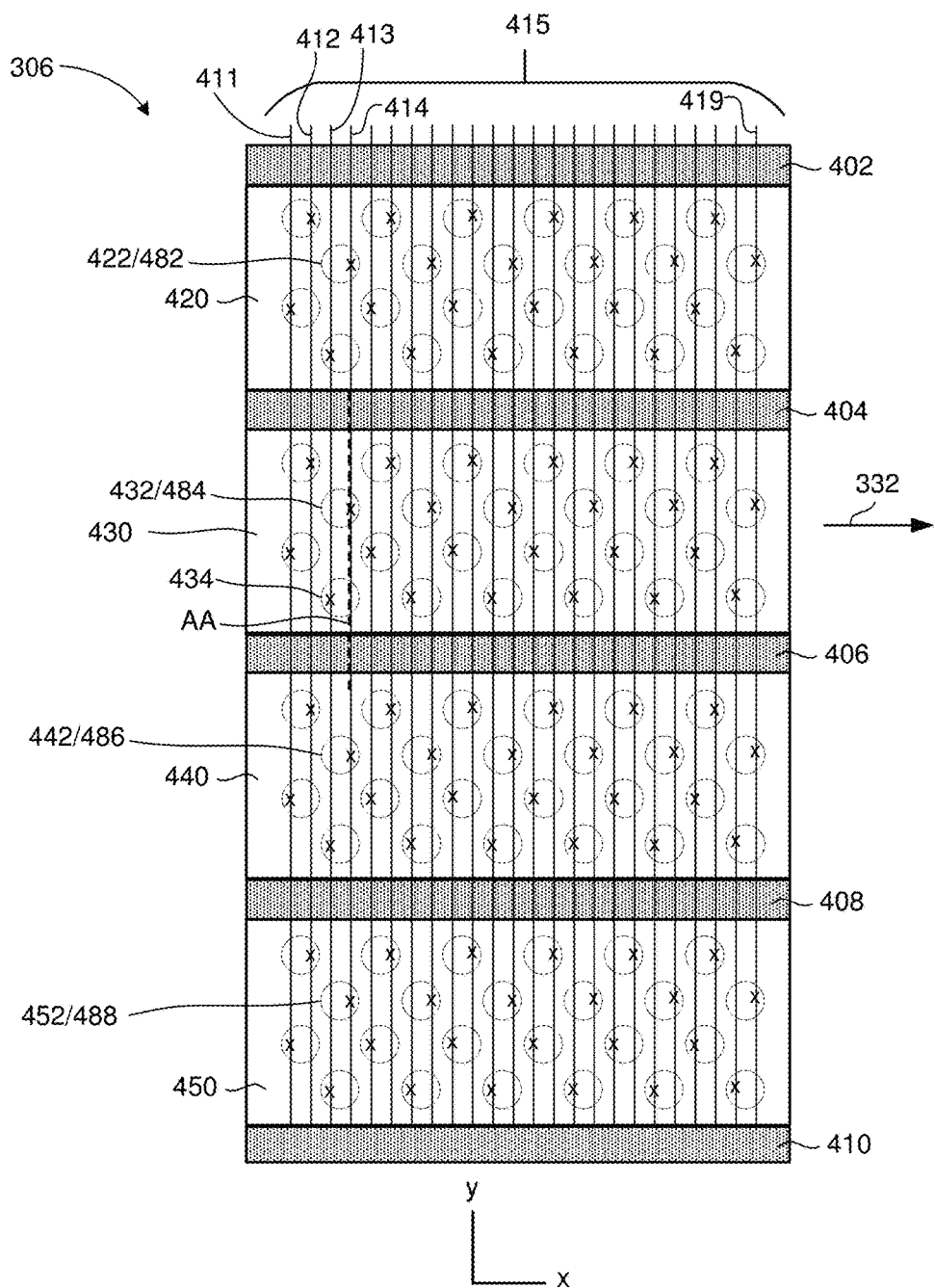
FIG. 4B depicts a top view of a portion of a block of memory cells.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of arrow 332. In one embodiment, the memory array will have 60 layers. Other embodiments have less than or more than 60 layers (e.g., 216 layers). However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines are connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as strings. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
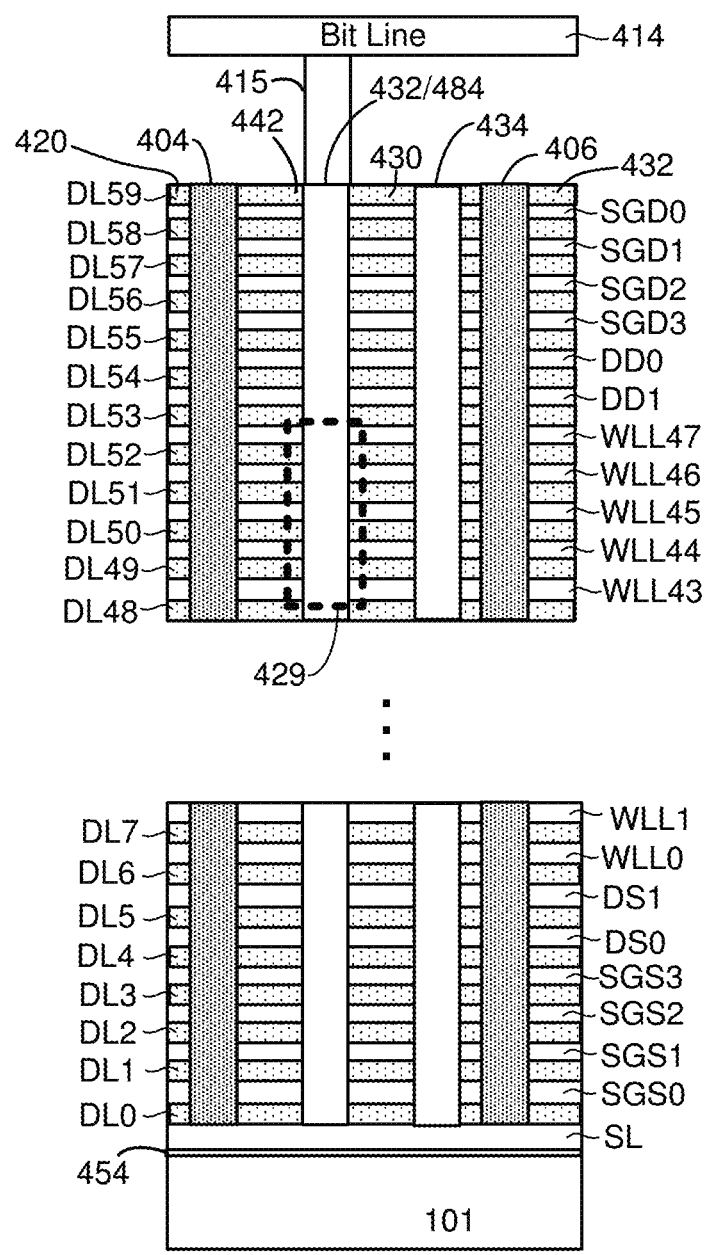
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store host data (data provided from the host, such as data from a user of the host), while a data memory cell is eligible to store host data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 4C. As mentioned above with respect to FIG. 4B, in one embodiment local interconnects 402, 404, 406, 408 and 410 break up each conductive layers into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
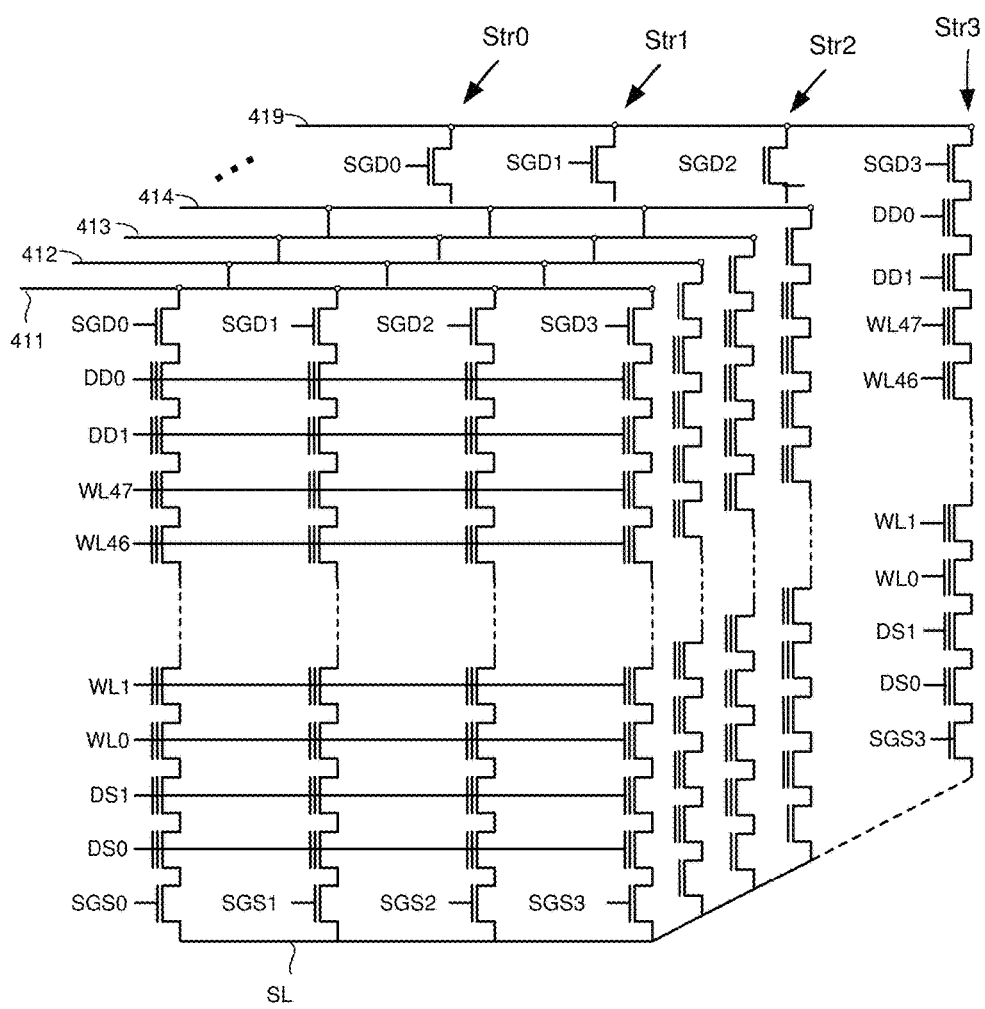
FIG. 4F is a schematic of a plurality of NAND strings.

FIG. 4F shows physical word lines WLL0-WLL47 running across the entire block. The structure of FIG. 4F corresponds to portion 306 in Block 2 of FIG. 4A, including bit lines 411, 412, 413, 414, . . . 419 depicted in FIG. 4B. Within the block, each bit line connected to four NAND strings. Drain side selection lines SGD0, SGD1, SGD2 and SGD3 are used to determine which of the four NAND strings connect to the associated bit line. The block can also be thought of as divided into four sub-blocks, which are referred to as strings. Each string includes multiple vertical NAND strings. In one embodiment, each block include four strings and the four strings are mutually exclusive sets of the NAND strings of the block such that each string includes a different one quarter of all the NAND strings of a block. Figure labels the four strings as Str0, Str1, Str2 and Str 3. String Str0 corresponds to those vertical NAND strings controlled by SGD0 and SGS0, string Str1 corresponds to those vertical NAND strings controlled by SGD1 and SGS1, string Str2 corresponds to those vertical NAND strings controlled by SGD2 and SGS2, and string Str3 corresponds to those vertical NAND strings controlled by SGD3 and SGS3.

Although the example memory system of FIGS. 4-4F is a monolithic three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

Figures 5, 6:
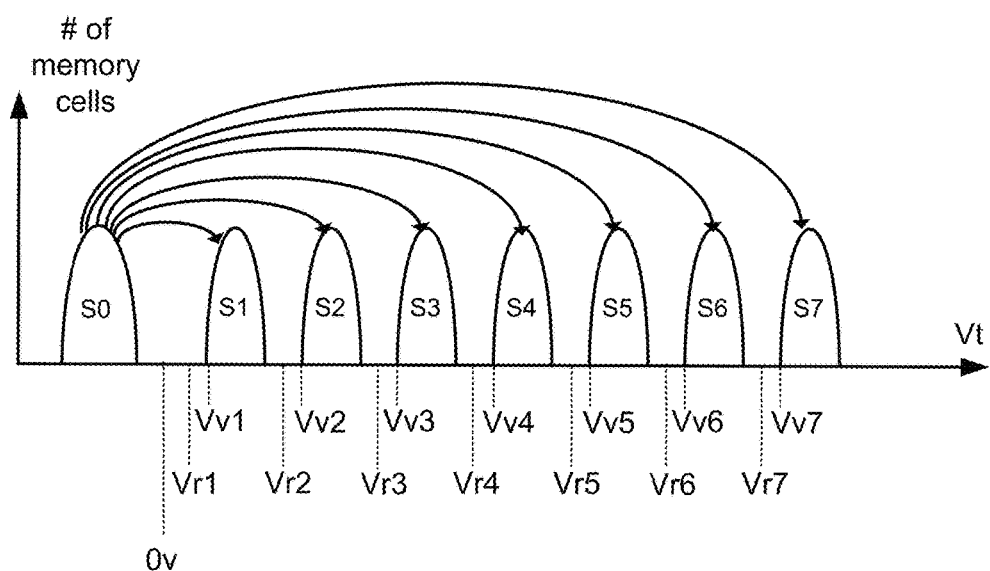
FIG. 5 depicts threshold voltage distributions and full sequence programming.
FIG. 6 is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected. In other embodiments, other data encoding schemes can be used.

FIG. 5 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, ... ) the memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7 in a single pass. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 6 represent the full sequence programming. The technology described herein can also be used with other types of programming in addition to full sequence programming (including, but not limited to, multiple stage/phase programming). In some embodiments, data states S1-S7 can overlap, with controller 122 relying on ECC to identify the correct data being stored.

FIG. 6 is a table describing one example of an assignment of data values to data states. In the table of FIG. 6, S0=111, S1=110, S2=200, S3=000, S4=010, S5=011, S6=001 and S7=101. Other encodings of data can also be used. No particular data encoding is required by the technology disclosed herein. In one embodiment, when a block is subjected to an erase operation, all memory cells are moves to data state S0, the erased state. In the embodiment of FIG. 6, all bits stored in a memory cell are 1 when the memory cells is erased (e.g., in data state S0).

Figure 7A:
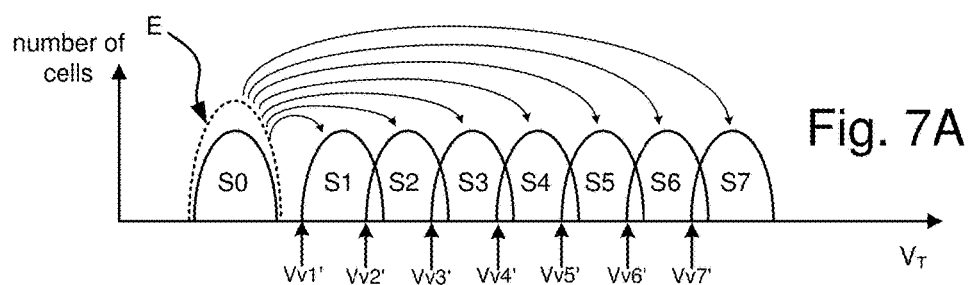
FIGS. 7A and 7B depict threshold voltage distributions and an example of a multi-pass programming process.
Figure 7B:
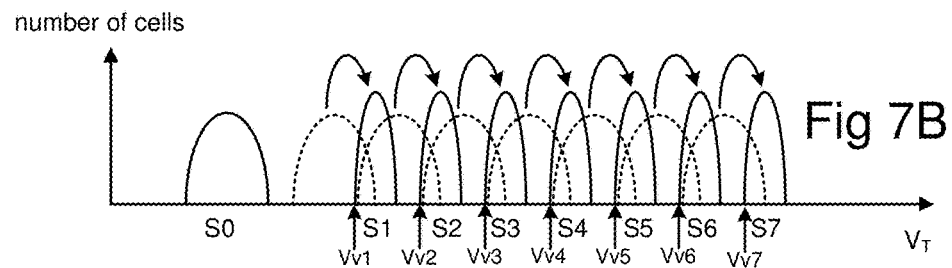

FIGS. 7A and 7B described one example of a multi-pass programming process, referred to a Foggy-Fine Programming. FIG. 7A depicts the first pass of the multi-pass programming process, which includes programming the memory cells from the erased state (E) to any of the programmed data states S1-S7, similar to full sequence programming. However, rather than using the standard verify reference voltages (e.g., Vv1, Vv2, Vv3, Vv4, Vv5, Vv6, and Vv7), the process of FIG. 7A uses an alternate set of verify reference voltages (e.g., Vv1', Vv2', Vv3', Vv4,' Vv5', Vv6', and Vv7') that are each slightly lower than the corresponding standard verify reference voltage. Thus, the threshold voltages of FIG. 7A can be thought of as intermediate threshold voltage distributions (or intermediate data states) that are at lower voltages than the threshold voltages of FIG. 5. Note that memory cells in the erased state E that are to be in data state S0, are inhibited from programming.

FIG. 7B depicts the second (and last) pass of the multi-pass programming process, which includes programming the memory cells to tighten the threshold distributions. Thus, the memory cells are programmed from the intermediate threshold voltage distributions (or intermediate data states) of FIG. 7A to the final or target threshold voltage distributions (or data states) of FIG. 7B using the standard verify reference voltages (e.g., Vv1, Vv2, Vv3, Vv4, Vv5, Vv6, and Vv7). FIG. 7A is referred to as the Foggy pass and FIG. 7B as the Fine Pass. In one embodiment, the Foggy pass of FIG. 7A is performed for a given word line, followed by the Foggy pass for the next word line. The Foggy pass for the next word line could give rise to interference for the given word line, thereby widening the intermediate threshold voltage distributions, which could lead to errors when reading the data. However, the Fine pass of FIG. 7B is subsequently performed after Foggy pass for the next word line, removing or reducing the effects of interference from the next word line. Note that memory cells in the erased state E that are to be in data state S0, are inhibited from programming.

Figure 8A:
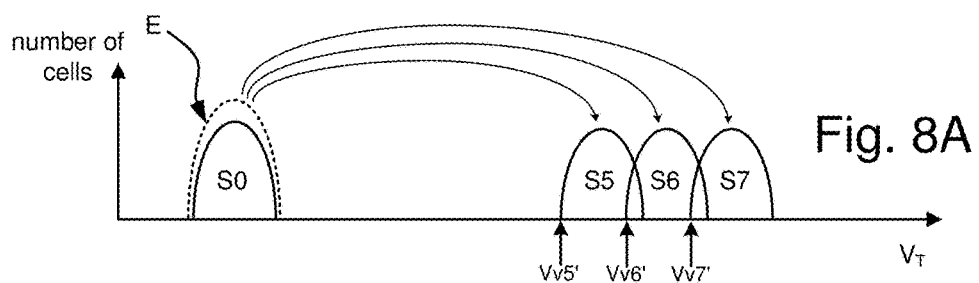
FIGS. 8A and 8B depict threshold voltage distributions and an example of a multi-pass programming process.
Figure 8B:
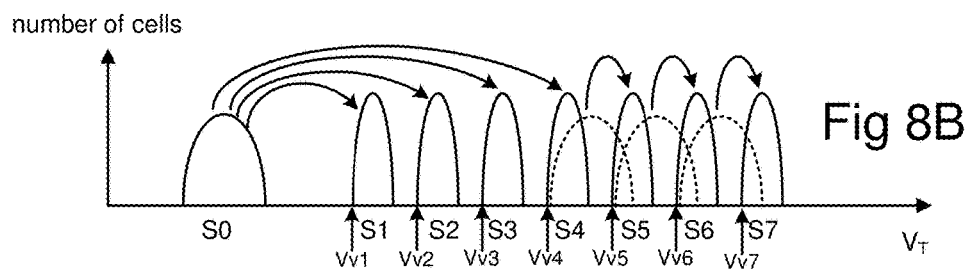

FIGS. 8A and 8B described one example of a multi-pass programming process, referred to a High States First Foggy-Fine Programming. FIG. 8A depicts the first pass of the multi-pass programming process, which includes only performing programming for memory cells that are targeted for the high data states S5, S6 and S7. Those memory cells are programmed to intermediate threshold voltage distributions (intermediate data states) using the alternate verify reference voltages (e.g., Vv5', Vv6', and Vv7'). Memory cell targeted for data states S0, S1, S2, S3 and S4 are inhibited from programming during the first pass.

FIG. 8B depicts the second (and last) pass of the multi-pass programming process. During the second pass, those memory cells that are targeted for the high data states S5, S6 and S7 and were programmed to intermediate threshold voltage distributions (intermediate data states) during the first pass, are programmed from the intermediate threshold voltage distributions (or intermediate data states) of FIG. 8A to the final or target threshold voltage distributions (or data states) of FIG. 8B using the standard verify reference voltages (e.g., Vv5, Vv6, and Vv7). Concurrently, those memory cells that are targeted for the low data states S1, S2, S3 and S4 are programmed to their targeted data states using the standard verify reference voltages (e.g., Vv1, Vv2, Vv3, and Vv4). Memory cells in the erased state E that are to be in data state S0 are inhibited from programming. Note that the process of FIG. 8A is also referred to as Foggy and the process of FIG. 8B is also referred to as Fine.

In one embodiment, the first pass of FIG. 8A is performed for a given word line, followed by the first pass for the next word line. The first pass for the next word line could give rise to interference for the given word line, thereby widening the intermediate threshold voltage distributions, which could lead to errors when reading the data. However, the second pass of FIG. 8B is subsequently performed after first pass for the next word line, thereby, removing or reducing the effects of interference from the next word line.

Other multi-pass programming processes, in addition to those of FIGS. 7A, 7B, 7C and 7D can also be used. Although the multi-pass programming processes of FIGS. 7A, 7B, 7C and 7D uses two passes, other embodiments can use more than two passes.

FIG. 9A is a flowchart describing one embodiment of a process for programming that is performed by controller 122. In some embodiments, rather than have a dedicated controller, the host can perform the functions of the controller. In step 702, controller 122 sends instructions to one or more memory die 108 to program data. In step 704, controller 122 sends one or more addresses to one or more memory die 108 that indicate where to program the data. In step 706, controller 122 sends the data to be programmed to the one or more memory die 108. In step 708, controller 122 receives a result of the programming from the one or more memory die 108. Example results include that the data was programmed successfully, an indication that the programming operation failed, and indication that the data was programmed but at a different location, or other result. In step 710, in response to the result received in step 708, controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, controller 122 would receive host data and an instruction to program from the host, and the controller would run the ECC engine 224 to create code words from the host data, as known in the art and described in more detail below. These code words are the data transmitted in step 706. Controller can also scramble the data to achieve wear leveling with respect to the memory cells.

FIG. 9B is a flowchart describing one embodiment of a process for programming. The process of FIG. 9B is performed by a memory die 108 in response to the steps of FIG. 7A (i.e., in response to the instructions, data and addresses from controller 122). In one example embodiment, the process of FIG. 9B is performed on memory die 108 using the one or more control circuits discussed above, at the direction of state machine 112. The process of FIG. 9B can be used to implement the full sequence programming discussed above with respect to FIG. 5. Additionally, the process of FIG. 9B can be used to implement each pass of the multi-pass programming processes of FIGS. 7A, 7B, 8A and 8B, as well as other multi-pass programming processes.

Typically during programming, a program voltage is applied to the control gates (via a selected word line) during a program operation as a series of program pulses. Between programming pulses are a set of verify pulses to perform verification. In many implementations, the magnitude of the program pulses is increased with each successive pulse by a predetermined step size. In step 770 of FIG. 7B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. Other voltages can also be used, as per the specific implementation. In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage(s).

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 20 and 30; however, other values can be used. If the program counter PC is not less than the program limit value PL, then the program process is considered to have failed and a status of FAIL is reported in step 788. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 786, the process loops back to step 772 and another program pulse is applied to the selected word line so that another iteration (steps 772-786) of the programming process of FIG. 9B is performed.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 5) or verify operation (e.g. see verify reference voltages Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 10 is a table that provides one example of the order of programming the different strings of memory structure 126 when implementing the full sequence programming of FIG. 5 and the programming process of FIG. 9B. Each box of the table of FIG. 10 includes an integer that represent the step in the order of programming all of the strings of a block. In this embodiment, a string is the unit of programming. This means that the programming process of FIG. 9B concurrently programs the memory cells connected a selected word line that are in the same string (unless the memory cell is to remain in S0). All memory cells (expect those that are to remain in S0) within a unit of programming are programmed concurrently (ie by the same programming pulses). So, for the embodiment of FIG. 10, string Str0 of word line WL0 is the first string to be programmed for a block. String Str1 of word line WL0 is the second string to be programmed for the block. String Str2 of word line WL0 is the third string to be programmed for the block. String Str3 of word line WL0 is the fourth string to be programmed for the block. String Str0 of word line WL1 is the fifth string to be programmed for the block, and so on. String Str3 of word line WL47 is the three hundred and eighty fourth string to be programmed for the block.

FIG. 11 is a table that provides one example of the order of programming the different strings of memory structure 126 when implementing the multi-pass programming of FIGS. 7A and B or 8A and B, and the programming process of FIG. 9B. The left most column indicates the word line. The second column indicates whether the row applies to the Foggy pass (FIGS. 7A and 8A) or the Fine pass (FIGS. 7B and 8B) for the word line. The four columns on the right indicate the strings: Str0, Str1, Str2 and Str3. Each box of the table of FIG. 11 includes an integer that represent the step in the order of programming all of the strings of a block. In this embodiment, a string is the unit of programming. In the embodiment of FIG. 11, the Foggy pass for string Str0 of word line WL0 is the first step for programming a block, the Foggy pass for string Str1 of word line WL0 is the second step for programming the block, the Foggy pass for string Str2 of word line WL0 is the third step for programming the block, and the Foggy pass for string Str3 of word line WL0 is the fourth step for programming the block. The Foggy pass for string Str0 of word line WL1 is the fifth step for programming a block, the Foggy pass for string Str1 of word line WL1 is the sixth step for programming the block, the Foggy pass for string Str2 of word line WL1 is the seventh step for programming the block, and the Foggy pass for string Str3 of word line WL1 is the eight step for programming the block. The Fine pass for string Str0 of word line WL0 is the ninth step for programming a block, the Fine pass for string Str1 of word line WL0 is the tenth step for programming the block, the Fine pass for string Str2 of word line WL0 is the eleventh step for programming the block, and the Fine pass for string Str3 of word line WL0 is the twelfth step for programming the block. And so on.

In order to implement the embodiment of FIG. 11, the controller 122 needs to cache data being programmed for up to two word lines. For example, during steps 0-11, controller 122 needs to cache data being programmed for word lines WL0 and WL1. This data can be stored in RAM 122b (see FIG. 2) or RAM 216, which is at or in Controller 122. In an embodiment where a string (e.g., Str0, Str1, Str2, Str3) includes about 131,072 memory cells (which is 16 KB) on each word line, then Controller 122 needs to cache (4 stings)*(2 word lines)*(16 KB)*(3 bit/memory cell)=384

KB per plane. It can be expensive dedicate this much space to caching for programming and it takes time to perform the caching. Therefore, it is desired to reduce the caching.

To reduce the caching it is proposed to use a multi-step programming process (such as the processes of FIGS. 7A. 7B, 8A and 8B, as well as other multi-step programming processes), but perform these processes in a different order than as described above with respect to FIG. 11. More specifically, it is proposed that programming proceed according to a string based program sequence.

FIG. 12 is a flow chart describing, at a high level, one embodiment of a string based program sequence that includes separately programming units of programming (e.g., memory cells connected to a common word line and in a common string, or other groups of memory cells). In step 802, the system performs programming for memory cells that are connected to two adjacent word lines and are part of a first group of memory cells (e.g., in a same string). In step 804, the system performs programming for memory cells that are connected to the two adjacent word lines and are part of a second group of memory cells (e.g., in a same string). In one embodiment, step 802 is performed followed by performing step 804. In one embodiment, the programming performed in step 802 and step 804 includes implementing a multi-step programming process (such as the processes of FIGS. 7A. 7B, 8A and 8B, as well as other multi-step programming processes) using the process of FIG. 9B (or other programming method). In one example implementation, each of steps 802 and 804 include performing a Foggy pass for one word line and a Fine pass for the other word line. The process of FIG. 12 is repeated multiple times in order to program all strings of a block.

FIG. 13 is a table that provides more details of the proposed sequence of programming. That is, the table is an example of the order of programming the different strings of memory structure 126 when implementing the multi-pass programming of FIGS. 7A and B or 8A and B, and the programming process of FIG. 9B. The left most column indicates the word line. The second column indicates whether the row applies to the Foggy pass (FIGS. 7A and 8A) or the Fine pass (FIGS. 7B and 8B) for the word line. The four columns on the right indicate the strings: Str0, Str1, Str2 and Str3. Each box of the table of FIG. 13 includes an integer that represent the step in the order of programming all of the strings of a block. In this embodiment, a string is the unit of programming and programming is performed for memory cells that are connected to two adjacent word lines and are part of a same string (e.g., Str0, Str1, Str2, Str3) followed by performing programming for memory cells that are connected to the same two adjacent word lines and are part of a next string (e.g., Str0, Str1, Str2, Str3).

In the embodiment of FIG. 13, the Foggy pass for string Str0 of word line WL0 is the first step for programming a block, the Foggy pass for string Str0 of word line WL1 is the second step for programming the block, the Fine pass for string Str0 of word line WL0 is the third step for programming the block, the Foggy pass for string Str1 of word line WL0 is the fourth step for programming the block, and so on as depicted in FIG. 13. Note that the end word lines WL0 and WL47 represent start and stop deviations from the repeating process described by FIG. 14.

Figures 14, 15:
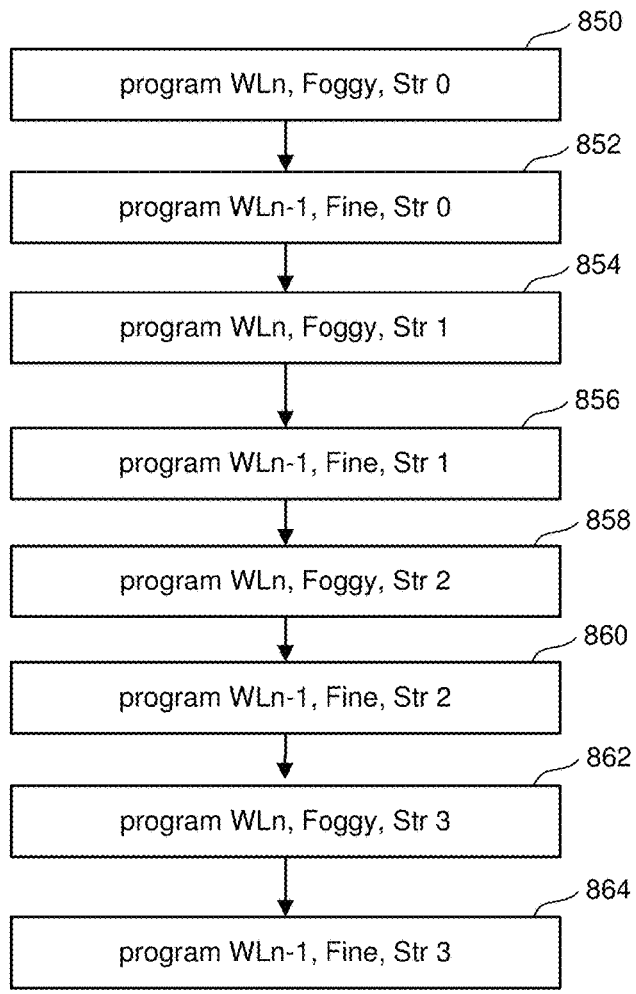
FIG. 14 is a flow chart describing one embodiment of a multi-pass programming process.
FIG. 15 is a table describing the contents of a cache during various steps of a multi-pass programming process.

FIG. 14 is a flow chart describing one embodiment of a process that is repeated multiple times to program all strings of a block according to the embodiment of FIG. 13. The process of FIG. 14 is performed by and at the direction of Controller 122 instructing memory die 108 to perform each step. Additionally, the process of FIG. 14 is repeated many times when programming a block; for example, the process of FIG. 14 can be repeated for each pair of adjacent word lines (except, in some embodiments, the first and last word lines).

In step 850 of FIG. 14, the system programs the Foggy pass for string Str 0 of word line WLn. Step 850 is one example implementation of step 28 of FIG. 13. In step 852, the system programs the Fine pass for string Str 0 of word line WLn-1. Step 852 is one example implementation of step 29 of FIG. 13. In step 854, the system performs the Foggy pass for string Str 1 of word line WLn. Step 854 is an example implementation of step 30 of FIG. 13. In step 856, the system programs the Fine pass for string Str 1 of word line WLn-1. Step 856 is an example of performing step 31 of FIG. 13. In step 858, the system programs the Foggy pass for string Str 2 of word line WLn. Step 58 is example implementation of step 32 of FIG. 13. In step 860, the system programs the Fine pass for string Str 2 for word line n-1. Step 860 is an example implementation of step 33 of FIG. 133. In step 862, the system programs the Foggy pass for string Str 3 for word line WLn. Step 862 is an example implementation of step 34 of FIG. 13. In step 864, the system programs the Fine pass for string Str 3 for word line WLn-1. Step 864 is an example implementation of step 35 of FIG. 13. In the embodiment of FIGS. 13-14, the system includes four strings in a block. In other embodiments, more or less than four strings can be used.

FIG. 15 is a table which indicates what data needs to be cached during the steps of programming. As an example, steps 28-35 of FIG. 13 are used for illustration purposes; however, table 15 applies to the other steps of FIG. 13 as well. When performing steps 28 and 29 (which are performed sequentially), controller 122 would have previously needed to cache data from string Str 0 of word line WL3, string Str 1 of word line WL3, string Str 2 of word line WL3, string Str 3 of word line WL3, and string Str 0 of word line WL4 (WL3 and WL4 are adjacent word lines). When performing steps 30 and 31 of FIG. 13 (which are performed sequentially), controller 122 would previously had to cache the data for string Str 1 of word line WL3, string Str 2 of word line WL3, string Str 3 of word line WL3, string Str 0 of word line WL4, and string Str 1 of word line WL4. When performing steps 32 and 33 of FIG. 13 (which are performed sequentially), controller 122 would have previously cached data for string Str 2 of word line WL3, string Str 3 of word line WL3, string Str 0 of word line WL4, string Str 1 of word line WL4, and string Str 2 of word line WL4. When performing steps 34 and 35 of FIG. 13 (which are performed sequentially), controller 122 would have had to previously cache data for string Str 3 of word line WL3, string Str 0 of word line WL4, string Str1 of word line WL4, string Str 2 of word line WL4, and string Str 3 of word line WL4. Note that after performing steps 28 and 29, data for string Str 0 of word line WL3 can be purged from the cache. After performing steps 30 and 31, data for string Str 1 of word line WL3 can be purged from the cache. After performing steps 32 and 33, data for string Str 2 of word line WL3 can be purged from the cache. Therefore, it can be seen from FIG. 15 that at any given time, controller 122 needs to cache data for 5 strings. This means the cache must be able to store (5 strings)*(16 KB per string)*(3 bit/memory cell)=240 KB per plane. This represents a 37% reduction in the needed cache size with the proposed programming scheme of FIG. 13 as compared to the programming scheme of FIG. 11.

Figure 16:
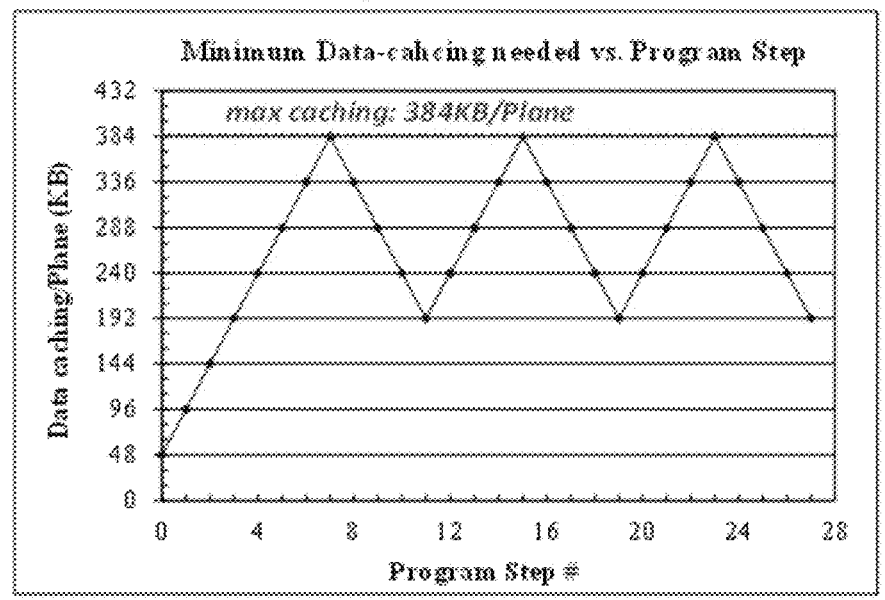
FIG. 16 is a graph describing amount of data cached versus step of a multi-pass programming process.
Figure 17:
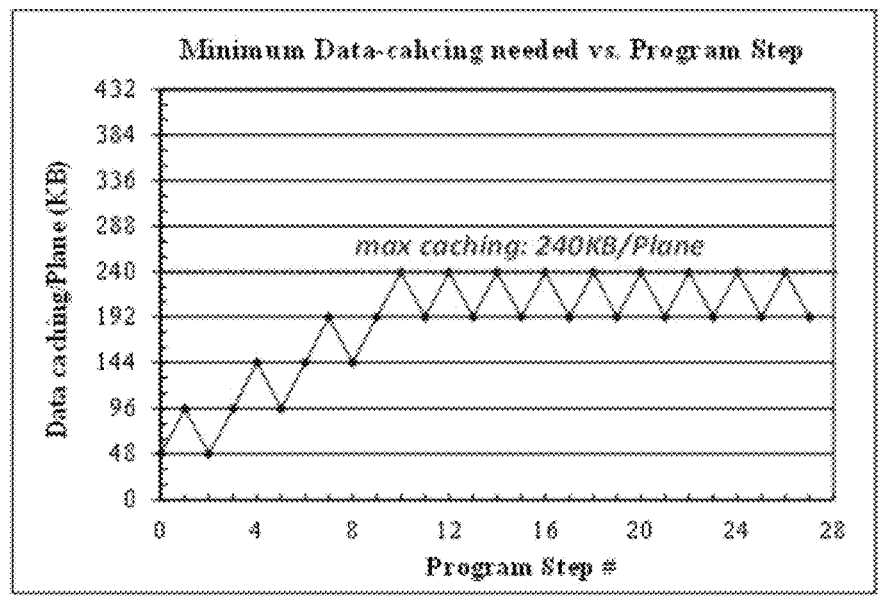
FIG. 17 is a graph describing amount of data cached versus step of a multi-pass programming process.

FIG. 16 is a graph of data caching per plane versus program step number (ie steps from FIG. 11) for the embodiment of FIG. 11. FIG. 17 is a graph depicting data caching per plane versus program step number (ie steps from FIG. 13) for the embodiment of FIG. 13. The graphs of FIGS. 16 and 17 show that the embodiment of FIG. 11 has a max caching of 384 KB per plane while the embodiment of FIG. 13 is a max caching of 240 KB per plane, which represents a 37% reduction in needed cache size.

FIGS. 18A and 18B describe another example of a multi-pass programming process which can be implemented by the technology described above. FIG. 18A depicts the first pass of the multi-pass programming process, which includes only performing programming for memory cells that are targeted for data states S4, S5, S6 and S7. Those memory cells are programmed to an intermediate threshold voltage distribution IM using the verify reference voltage VvIM. FIG. 18B depicts the second (and last) pass of the multi-pass programming process. During the second pass, those memory cells that are targeted for data states S4, S5, S6 and S7 are programmed from intermediate threshold voltage distribution IM to a final or target threshold voltage distributions (or data states) S4, S5, S6 and S7 using the standard verify reference voltages (e.g., Vv4, Vv5, Vv6, and Vv7). Concurrently, those memory cells that are targeted for data states S1, S2, and S3 are programmed to their target data states using the standard verify reference voltages (e.g., Vv1, Vv2, and Vv3). Memory cells in the erased state E that are to in the data state 0 are inhibited from programming.

FIG. 19 is a table describing an example of an assignment of data values to data states that can be used with the embodiment of FIGS. 18A and 18B. In the table of FIG. 19, S0=111, S1=011, S2=001, S3=101, S4=101, S5=110, S6=010, and S7=000. In the embodiment of FIG. 19, the lower page can easily be read by performing a read operation with word line voltage on the selected word line at Vr 4 (see FIG. 5).

The embodiment of FIGS. 18A and 18B can be performed using the order of programming depicted in the table of FIG. 13. Although the embodiment of FIGS. 18A and 18B do not have Fine and Foggy, the Foggy pass of FIG. 13 corresponds to the first pass of FIG. 18A and the Fine pass of FIG. 13 corresponds to the second pass of FIG. 18B.

Because in the first pass of FIG. 18A the system only programs memory cells targeted for states S4-S7, reading whether a memory cell is the state E or state IM after the first pass and before the second pass allows the system to know the data of the lower page (see FIG. 19). Therefore, there is no need for the controller 122 to store the data for the lower page in the controller's RAM after completing lower page programming (first pass) of FIG. 18A. However, when starting the second pass of the multi-pass programming process of FIG. 18B to program the upper and middle pages, the data for the lower page should be copied to a safe location to guard against power loss or some other data destroying event during the programming process of the second pass. In some embodiments, the controller will read back the lower page into its own RAM or store the lower page into another set of non-volatile memory cells using only one bit per memory cell. Using the string-based program order of FIG. 13 results in the amount of lower page data needed to be copied to other memory cells (or controller RAM) being reduced by 37% because lower page data only needs to be stored for 5 strings rather than 8 strings. Note that while the system can choose to copy lower page data one string at a time for the string about to be programmed, such back and forth reading, writing, and programming is much slower than copying multiple strings at one time and then programming multiple strings. For example, when using the process of FIGS. 18A and 18B, and programming the second pass (middle page and upper page according to FIG. 18B) of string 0 of word line WL3, using the programming order of FIG. 11, controller 122 would need to store lower page data for all 4 strings of WL 3 and all four strings of WL 4. However, when using the programming order of FIG. 13, controller 122 need only store lower page data for all 4 strings of word lines WL3 and Str 0 of word line WL4.

One embodiment includes a non-volatile memory apparatus, comprising: a plurality of non-volatile memory cells arranged in groups of memory cells; a plurality of word lines connected to the memory cells, each word line is connected to multiple groups of the memory cells, each group of memory cells is connected to multiple word lines; and one or more control circuits connected to the memory cells and the word lines, the one or more control circuits are configured to separately program the groups of memory cells including performing programming for memory cells that are connected to two adjacent word lines and are part of a first group of memory cells followed by performing programming for memory cells that are connected to the two adjacent word lines and are part of a second group of memory cells.

One embodiment includes a method of programming non-volatile memory, comprising: performing a first pass of a multi-pass programming process for memory cells connected to a first word line and in a first unit of programming for the first word line (see e.g., step 20 of FIG. 13); performing the first pass of the multi-pass programming process for memory cells connected to a second word line and in a first unit of programming for the second word line (see e.g., step 850 of FIG. 14 and step 28 of FIG. 13), the second word line is adjacent to the first word line; after the performing the first pass of the multi-pass programming process for the memory cells connected to the second word line and in the first unit of programming for the first word line, performing a last pass of the multi-pass programming process for the memory cells connected to the first word line and in the first unit of programming for the first word line (see e.g., step 852 of FIG. 14 and step 29 of FIG. 13); and after the performing the last pass of the multi-pass programming process for the memory cells connected to the first word line and in the first unit of programming for the first word line, performing the first pass of the multi-pass programming process for memory cells connected to the second word line and in a second unit of programming for the second word line (see e.g., step 854 of FIG. 14 and step 30 of FIG. 13).

One embodiment includes an apparatus, comprising: a memory interface configured to connect to a memory that includes a plurality of non-volatile memory cells arranged in units of serially connected memory cells and a plurality of word lines connected to the units, each word line of the plurality of word lines is connected to one memory cell of each unit; a host interface; and one or more processing circuits connected to the memory interface and the host interface, the one or more processing circuits configured to start multi-pass programming for memory cells connected to a particular word line and in a particular subset of units subsequent to completing multi-pass programming for memory cells connected to an adjacent word line and in an adjacent subset of units, the adjacent word line is next to the particular word line.

One embodiment includes a non-volatile memory apparatus, comprising: a plurality of non-volatile memory cells arranged in a plurality of NAND strings; a plurality of word lines, each word line of the plurality of the word lines is connected to each NAND string of the plurality of NAND strings; a plurality of bit lines connected to the NAND strings; a plurality of select lines connected to the NAND strings, the select lines configured to select different subsets of the NAND strings; and means for performing a multi-pass programming process for the memory cells by starting programming for memory cells connected to a particular word line and a particular subset of the NAND strings and then completing programming for memory cells connected to an adjacent word line and the particular subset of NAND strings prior to starting programming for memory cells connected to the particular word line and a next subset of the NAND strings.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory apparatus, comprising:
   a plurality of non-volatile memory cells arranged in groups of memory cells;
   a plurality of word lines connected to the memory cells, each word line is connected to multiple groups of memory cells, each of the groups of memory cells is connected to multiple word lines of the plurality of word lines; and
   one or more control circuits connected to the memory cells and the word lines, the one or more control circuits are configured to separately program the groups of memory cells using a multi-pass programming process including performing programming of memory cells that are directly connected to two directly adjacent word lines and are part of a first group of memory cells followed by performing programming of memory cells that are directly connected to the two directly adjacent word lines and are part of a second group of memory cells such that the one or more control circuits are configured to complete the multi-pass programming process for all memory cells directly connected to one of the two directly adjacent word lines before starting the multi-pass programming process for memory cells directly connected to another word line.

2. The non-volatile memory apparatus of claim 1, wherein:
   each group of memory cells comprises multiple units of serially connected memory cells;
   each unit of serially connected memory cells connects to all of the word lines of the plurality of word lines;
   each group of memory cells connects to all of the word lines of the plurality of word lines; and
   each group of memory cells is mutually exclusive of other groups of memory cells.

3. The non-volatile memory apparatus of claim 2, wherein:
   the programming for memory cells that are directly connected to two directly adjacent word lines and are part of the first group of memory cells comprises sequentially performing a first pass of a multi-pass programming process and a last pass of the multi-pass programming process.

4. The non-volatile memory apparatus of claim 1, wherein:
   the programming for memory cells that are directly connected to two directly adjacent word lines and are part of the first group of memory cells and the programming for memory cells that are directly connected to the two directly adjacent word lines and are part of the second group of memory cells are part of a multi-pass programming process.

5. The non-volatile memory apparatus of claim 4, wherein:
   the one or more control circuits are configured to perform the multi-pass programming process by, after the completing the multi-pass programming process for the memory cells directly connected to a first word line and in a first group, starting the multi-pass programming process for memory cells directly connected to a second word line and in a second group.

6. The non-volatile memory apparatus of claim 4, wherein:
   the one or more control circuits are configured to start the multi-pass programming for memory cells connected to a particular word line and in a particular group subsequent to completing the multi-pass programming for memory cells connected to an adjacent word line and in an adjacent group, the adjacent word line is next to the particular word line.

7. The non-volatile memory apparatus of claim 4, wherein:
   the one or more control circuits are configured to perform the multi-pass programming process for the memory cells by starting programming for memory cells connected to a particular word line and in a particular group and then completing programming for memory cells connected to an adjacent word line and in the particular group prior to starting programming for memory cells connected to the particular word line and a next group.

8. The non-volatile memory apparatus of claim 1, further comprising:
   a plurality of select lines connected to the memory cells and the one or more control circuits, the select lines are configured to select the groups of memory cells, the non-volatile memory cells are arranged in NAND strings, the NAND strings are divided into groups of NAND strings, each group of the NAND strings comprises one of the groups of the memory cells.

9. The non-volatile memory apparatus of claim 1, wherein:
the one or more control circuits are configured to perform programming for memory cells that are directly connected to two directly adjacent word lines and are part of the first group of memory cells by programming memory cells directly connected to a first word line and are part of the first group of memory cells and subsequently programming memory cells directly connected to a second word line and are part of the first group of memory cells; and
the one or more control circuits are configured to perform programming for memory cells that are directly connected to the two directly adjacent word lines and are part of a second group of memory cells by programming memory cells directly connected to the first word line and are part of the second group of memory cells and subsequently programming memory cells directly connected to the second word line and are part of the second group of memory cells.

10. The non-volatile memory apparatus of claim 1, wherein:
the programming for memory cells that are directly connected to two directly adjacent word lines and are part of the first group of memory cells does not program the memory cells that are directly connected to the two adjacent word lines and are part of the second group of memory cells; and
the programming for memory cells that are directly connected to the two directly adjacent word lines and are part of the second group of memory cells does not program the memory cells that are directly connected to the two adjacent word lines and are part of the first group of memory cells.

11. The non-volatile memory apparatus of claim 1, wherein:
memory cells directly connected to a common word line and in a same group of memory cells comprise a unit of programming; and
the memory cells that are directly connected to the two directly adjacent word lines and are part of the first group of memory cells and the memory cells that are directly connected to the two directly adjacent word lines and are part of the second group of memory cells are in a same block.

12. The non-volatile memory apparatus of claim 1, wherein:
the plurality of non-volatile memory cells are arranged in a three dimensional monolithic memory structure.

13. A method of programming non-volatile memory, comprising:
performing a first pass of a multi-pass programming process for memory cells directly connected to a first word line and in a first unit of programming for the first word line;
performing the first pass of the multi-pass programming process for memory cells directly connected to a second word line and in a first unit of programming for the second word line, the second word line is directly adjacent to the first word line;
after the performing the first pass of the multi-pass programming process for the memory cells directly connected to the first word line and in the first unit of programming for the first word line and before the performing the first pass of the multi-pass programming process for the memory cells directly connected to the second word line and in the first unit of programming for the second word line, performing a last pass that completes the multi-pass programming process for the memory cells directly connected to a third word line and in the first unit of programming for the third word line;
after the performing the first pass of the multi-pass programming process for the memory cells directly connected to the second word line and in the first unit of programming for the second word line, performing the last pass of the multi-pass programming process for the memory cells directly connected to the first word line and in the first unit of programming for the first word line; and
after the performing the last pass of the multi-pass programming process for the memory cells directly connected to the first word line and in the first unit of programming for the first word line, performing the first pass of the multi-pass programming process for memory cells directly connected to the second word line and in a second unit of programming for the second word line.

14. The method of claim 13, further comprising:
performing the last pass of the multi-pass programming process for the memory cells directly connected to the second word line and in the first unit of programming for the second word line; and
performing the last pass of the multi-pass programming process for memory cells directly connected to the second word line and in the second unit of programming for the second word line.

15. The method of claim 13, wherein:
the first unit of programming for the first word line and the first unit of programming for the second word line are aligned on a common first set of NAND strings; and
the second unit of programming for the second word line is implemented in memory cells of a second set of NAND strings, the second set of NAND strings is mutually exclusive of the first set of NAND strings.

16. The method of claim 13, wherein:
the performing the first pass of the multi-pass programming process for memory cells directly connected to the second word line and in the first unit of programming for the second word line does not provide programming to memory cells directly connected to the second word line and in the second unit of programming for the second word line.

17. The method of claim 13, further comprising:
performing the first pass of the multi-pass programming process for memory cells directly connected to the first word line and in a second unit of programming for the first word line;
after performing the first pass of the multi-pass programming process for memory cells directly connected to the second word line and in the second unit of programming for the second word line, performing the last pass of the multi-pass programming process for the memory cells directly connected to the first word line and in the second unit of programming for the first word line.

18. The method of claim 17, further comprising:

performing a first pass of a multi-pass programming process for memory cells directly connected to the first word line and in a third unit of programming for the first word line;

performing the first pass of the multi-pass programming process for memory cells directly connected to the second word line and in a third unit of programming for the second word line;

after the performing the first pass of the multi-pass programming process for the memory cells directly connected to the second word line and in the third unit of programming for the first word line, performing a last pass of the multi-pass programming process for the memory cells connected to the first word line and in the third unit of programming for the first word line; and after the performing the last pass of the multi-pass programming process for the memory cells directly connected to the first word line and in the third unit of programming for the first word line, performing the first pass of the multi-pass programming process for memory cells directly connected to the second word line and in a fourth unit of programming for the second word line.

19. An apparatus, comprising:

a memory interface configured to connect to a memory that includes a plurality of non-volatile memory cells arranged in units of serially connected memory cells and a plurality of word lines connected to the units, each word line of the plurality of word lines is connected to one memory cell of each unit, the units are arranged in groups of units;

a host interface; and one or more processing circuits connected to the memory interface and the host interface, the one or more processing circuits are configured to instruct the memory to perform programming for memory cells that are directly connected to a first pair of adjacent word lines and are part of a first group of units by performing multiple passes of a multi-pass programming process followed by programming for memory cells that are directly connected to the first pair of adjacent word lines and are part of a second group of units by performing multiple passes of the multi-pass programming process followed by programming for memory cells that are directly connected to a second pair of adjacent word lines and are part of the first group of units by performing multiple passes of the multi-pass programming, the first pair of adjacent word lines and the second pair of adjacent word lines have one word line in common.

20. The apparatus of claim 19, wherein:

the one or more processing circuits, the host interface and the memory interface comprise a memory controller.

21. A non-volatile memory apparatus, comprising:

a plurality of non-volatile memory cells arranged in a plurality of NAND strings;

a plurality of word lines, each word line of the plurality of the word lines is connected to each NAND string of the plurality of NAND strings;

a plurality of bit lines connected to the NAND strings;

a plurality of select lines connected to the NAND strings, the select lines configured to select different subsets of the NAND strings; and means for performing a multi-pass programming process for the memory cells by starting programming for memory cells directly connected to a particular word line and a particular subset of the NAND strings and then completing programming for memory cells directly connected to a first adjacent word line and the particular subset of NAND strings prior to starting programming for memory cells directly connected to the particular word line and a next subset of the NAND strings and subsequently starting programming for memory cells directly connected to a second adjacent word line and the particular subset of the NAND strings and then completing programming for memory cells directly connected to the particular word line and the particular subset of NAND strings prior to starting programming for memory cells directly connected to the second adjacent word line and the next subset of the NAND strings and subsequent to the starting programming for memory cells directly connected to the particular word line and a next subset of the NAND strings, the first adjacent word line and the second adjacent word line are both directly adjacent the particular word line.

\* \* \* \* \*